United States Patent
Park

(10) Patent No.: US 7,304,590 B2
(45) Date of Patent: Dec. 4, 2007

(54) ARITHMETIC DECODING APPARATUS AND METHOD

(75) Inventor: In-cheol Park, Daejeon Metropolitan (KR)

(73) Assignees: Korean Advanced Institute of Science & Technology, Yuseong-gu (KR); Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 11/337,615

(22) Filed: Jan. 24, 2006

(65) Prior Publication Data

US 2006/0220927 A1    Oct. 5, 2006

(30) Foreign Application Priority Data

Apr. 4, 2005  (KR)  .................. 10-2005-0028066

(51) Int. Cl.
 H03M 7/30    (2006.01)
(52) U.S. Cl. .................. 341/107; 341/51; 382/247
(58) Field of Classification Search ............. 341/51, 341/107; 382/247
See application file for complete search history.

(56) References Cited

U.S. PATENT DOCUMENTS

| | | | | |
|---|---|---|---|---|
| 6,055,338 | A * | 4/2000 | Endo et al. .................. | 382/247 |
| 6,646,578 | B1 | 11/2003 | Au | |
| 6,677,869 | B2 * | 1/2004 | Horie .................. | 341/107 |
| 6,690,307 | B2 | 2/2004 | Karczewicz | |
| 7,079,057 | B2 * | 7/2006 | Kim et al. .................. | 341/107 |
| 7,088,272 | B2 * | 8/2006 | Nomura .................. | 341/107 |
| 2003/0081850 | A1 | 5/2003 | Karczewicz et al. | |
| 2004/0260739 | A1 | 12/2004 | Schumann | |

FOREIGN PATENT DOCUMENTS

| | | |
|---|---|---|
| JP | 2003-319391 A | 11/2003 |
| JP | 2004-135251 A | 4/2004 |
| JP | 2006033335 A * | 2/2006 |
| KR | 10-2004-0035139 A | 4/2004 |
| KR | 10-2004-0075317 A | 8/2004 |
| KR | 10-2004-0095399 A | 11/2004 |
| KR | 10-2004-0098631 A | 11/2004 |
| KR | 10-2004-0106351 A | 12/2004 |
| KR | 10-2004-0106392 A | 12/2004 |
| KR | 10-2004-0106401 A | 12/2004 |

OTHER PUBLICATIONS

Dyer et al., Improved Throughput Arithmetic Coder for JPEG2000, IEEE, Oct. 2004, International Conference on Image Processing, vol. 4 pp. 2817-2820, Oct. 2004.*

* cited by examiner

Primary Examiner—Howard L. Williams
(74) Attorney, Agent, or Firm—Sughrue Mion Pllc.

(57) ABSTRACT

An arithmetic decoding method and apparatus are provided. The apparatus includes an arithmetic decoding apparatus comprising an arithmetic decoding unit determining a range of a most probable symbol and a range of a least probable symbol required to decode a current symbol, comparing a current offset and the range of the most probable symbol required to decode the current symbol, and determining and outputting the value of the current symbol. The apparatus also includes a predicted arithmetic decoding unit determining a range of a most probable symbol and a range of a least probable symbol which are required to decode a next symbol using a prediction that the current symbol is the most probable symbol, comparing a next offset and the range of the most probable symbol required to decode the next symbol, and determining and outputting a range of the next symbol.

16 Claims, 5 Drawing Sheets

ARITHMETIC DECODING APPARATUS AND METHOD

CROSS-REFERENCE TO RELATED PATENT APPLICATIONS

This application claims the priority of Korean Patent Application No. 10-2005-0028066, filed on Apr. 4, 2005, in the Korean Intellectual Property Office, the disclosure of which is incorporated herein in its entirety by reference.

BACKGROUND OF THE INVENTION

1. Technical Field

Apparatuses and methods consistent with the present invention relate to arithmetic decoding, and more particularly, to high-speed arithmetic decoding using a prediction technique.

2. Related Art

Image data is very large in size, and therefore, compression coding is required to store or transmit the image data. Arithmetic coding, which is an image data compression technique, arithmetically computes the range of a cumulative distribution function for a stream of input symbols. As a result, a codeword corresponding to the range of the cumulative distribution function is automatically acquired. Accordingly, it is possible to easily code even a long stream of input symbols.

The related art MPEG-4 Part 10 advanced video coding (AVC) standard, which is a video compression standard, has higher coding efficiency than the related art MPEG-4 Part 2 visual codec standard, and is designed to be robust with respect to errors and be network-friendly in consideration of rapidly changing wire and Internet environments.

The related art MPEG-4 Part 10 AVC standard adopts context adaptive binary arithmetic coding (CABAC) which is a type of arithmetic coding. CABAC is binary arithmetic coding to which context, that is, dynamic statistical characteristics, is applied. Since a related art entropy coder uses static statistics, the coding performance of the entropy coder is degraded when data with characteristics different from predetermined statistical characteristics is generated during decoding. That is, at least one bit is required even if generation of the symbol is expected with a very high probability and the symbol is substantially coded. For instance, even when a probability that a symbol "a" would be coded through Huffman coding is 0.99, a bit must be allocated to the symbol "a" to code the symbol "a".

CABAC uses binary arithmetic coding. One of the advantages of arithmetic coding is that it does not require integer bits of data to code a symbol. When the symbol "a" with the coding probability of 0.99 is coded continuously five times through Huffman coding, for example, it is possible to code the symbol "a" to only 1 bit through arithmetic coding. That is, each symbol can be coded to a 0.2 bit.

Related art CABAC encoding according to the MPEG-4 Part 10 AVC standard will briefly be described. First, binarization by which input data is transformed into binary values using various methods is performed. Since symbols are processed as binary values in CABAC, all data values must be transformed into binary values before performing arithmetic coding. Syntax elements obtained as a result of video processing may not be binary values. In this case, the syntax elements are transformed into binary values using various binarization methods. In CABAC according to the MPEG-4 Part 10 AVC standard, four binarization methods are defined.

When distributions of values of 0's or 1's obtained by binarizing the syntax elements are substantially the same, coding efficiencies of arithmetic coding to be performed on the syntax elements are also expected to be the same. Accordingly, the syntax elements are bypassed without being coded.

If the distribution of binary values converges on a specific symbol, arithmetic coding is performed as follows. First, the type of probability distribution for each coding stage is determined through context modeling. Context modeling is performed differently according to the type of a syntax element, the ordinal number of a symbol to which the syntax element corresponds in syntax, and the distribution of already-decoded values. Context modeling is performed to exactly predict the probable characteristics of a symbol that is currently being decoded. More specifically, context is comprised of the value of a most probable symbol (MPS) and the probabilities of a least probable symbol (LPS). Since binarization is performed before context modeling, the value of the MPS or the value of the LPS is 0 or 1. Thus, when the value of the MPS is determined, the value of the LPS is automatically determined, and when the probability of the LPS is determined, the probability of the MPS is computed by subtracting the probability of the LPS from 1. In general, the lower the probability of the LPS and the more the MPS is decoded, the higher the compression efficiency of CABAC.

When the value of the MPS and the probability of the LPS are determined through context modeling, a codeword is also determined. Arithmetic coding is performed while limiting the range of coding during data compression without continuously outputting a specific codeword. One of a lower bound, an upper bound, and a difference range between the lower range and the upper range is determined as the codeword. Also, the lower bound, or a value that can be represented with the smallest bit within a predetermined range, is determined as the codeword. In CABAC, the lower bound is determined to be the codeword.

A related art CABAC decoding process according to the MPEG-4 Part 10 AVC will now be described. FIG. 1 is a block diagram of a related art CABAC decoder. Three values, i.e., a context index, a range, and an offset, are required to decode a current symbol. Referring to FIG. 1, an LPS probability (k), an MPS value (k), a Range (k), and an Offset (k) are input to a binary arithmetic decoding unit 130 to decode a $k^{th}$ symbol S(k). The LPS probability (k) and the MPS value (k) corresponding to a context index (k) determined through context modeling are read from a memory 110. A method of acquiring the LPS probability (k) and the MPS value (k) from the context index (k) is described in greater detail in the related art MPEG-4 Part 10 AVC standard.

The range R(k,LPS) of the LPS is determined using the LPS probability (k) and the Range (k) as key values, based on an LPS range table. The range R(k,MPS) of the MPS is determined by subtracting the range R(k,LPS) of the LPS from the Range (k).

FIG. 2 illustrates a probability distribution section that includes the range R(k,LPS) of the LPS and the range R(k,MPS) of the MPS. The ranges R(k,LPS) and R(k,MPS) indicate the lengths of probability distribution sections of the LPS and the MPS respectively, not upper and lower bounds of the probability distribution sections of the LPS and the MPS.

After obtaining the range R(k,MPS), the range R(k,MPS) and the Offset (k) are compared. When the Offset (k) is equal to or greater than the range R(k,MPS), the $k^{th}$ symbol S(k)

is determined to be the value of the LPS. When the Offset (k) is less than the range R(k,MPS), the $k^{th}$ symbol S(k) is determined to be the value of the MPS. After decoding the $k^{th}$ symbol S(k), a new Range (k+1) and a new Offset (k+1) required for decoding the next symbol S(k+1) are determined. That is, when the $k^{th}$ symbol S(k) is determined as the value of the MPS, the new range Range(k+1) and the new Offset (k+1) are determined to be R(k,MPS) and Offset(k), respectively.

However, when the $k^{th}$ symbol S(k) is the value of the LPS, the new range Range(k+1) is determined to be R(k, LPS) and the new Offset (k+1) is a value obtained by subtracting the range R(k,MPS) from the Offset (k), since a lower bound of range is newly determined.

The ranges of the LPS and the MPS cannot be computed with unlimited precision and thus are limited to predetermined bits, i.e., 9 bits. To prevent the ranges from reducing to 0, they are always controlled to fall within a predetermined range from 0×0100 to 0×01fe before decoding a new symbol. If a range used to symbol decoding is out of the predetermined range, the range is adjusted to fall within the predetermined range through renormalization. When the range is readjusted, an offset corresponding to the range also is readjusted. Renormalization of the range and the offset is performed using a shift operation. The offset is shifted by the degree of shifting the range.

When renormalization is completed, the new range Range (k+1) and the new offset Offset(k+1) required for decoding the next symbol S(k+1) are prepared. The new range Range (k+1) and the new offset Offset(k+1) are input to the binary arithmetic decoding unit 130. The binary arithmetic decoding unit 130 is further given the LPS probability(k+1) and the MPS value(k+1) corresponding to a context Index(k+1) determined through context modeling to decode the next symbol S(k+1), and decodes the next symbol in the same manner in which the $k^{th}$ symbol S(k) is decoded.

As described above, in CABAC, by applying statistical characteristics dynamically, a probability to be applied to each symbol can be precisely predicted, and by compressing data to non-integer bits, compression efficiency can be increased. However, the complexity of CABAC is very high since context modeling is required and a range and an offset must be updated whenever each input symbol is coded or decoded. Therefore, development of a high-speed CABAC encoder and decoder is required to increase overall encoding and decoding performance. Further, as described above, in related art arithmetic coding and decoding, a range and offset required to decode a next symbol can be determined only after decoding a current symbol, thereby making it difficult to decode a plurality of symbols in parallel.

SUMMARY OF THE INVENTION

The present invention provides an arithmetic decoding apparatus and method capable of increasing decoding speed by decoding a plurality of symbols in parallel using a prediction technique.

The present invention also provides a computer readable recording medium on which a program for executing the arithmetic decoding method is stored.

According to an aspect of the present invention, there is provided an arithmetic decoding apparatus comprising an arithmetic decoding unit determining a range of a most probable symbol and a range of a least probable symbol which are required to decode a current symbol, comparing a current offset and the range of the most probable symbol required to decode the current symbol, and determining and outputting the value of the current symbol; and a predicted arithmetic decoding unit determining a range of a most probable symbol and a range of a least probable symbol which are required to decode a next symbol using a prediction that the current symbol is the most probable symbol, comparing a next offset and the range of the most probable symbol required to decode the next symbol, and determining and outputting a range of the next symbol.

According to another aspect of the present invention, there is provided an arithmetic decoding method comprising determining a range of a most probable symbol and a range of a least probable symbol which are required to decode a current symbol; determining a range of a most probable symbol and a range of a least probable symbol which are required to decode a next symbol using a prediction that the current symbol is the most probable symbol used to decode the current symbol; comparing a current offset and the range of the most probable symbol used to decode the current symbol, and determining the value of the current symbol; and comparing a next offset and the range of the most probable symbol used to decode the next symbol and determining a range of the next symbol.

According to yet another aspect of the present invention, there is provided a computer readable recording medium having embodied thereon a program for executing an arithmetic decoding method is stored, wherein the arithmetic decoding method comprises determining a range of a most probable symbol and a range of a least probable symbol which are required to decode a current symbol; determining a range of a most probable symbol and a range of a least probable symbol required to decode a next symbol using a prediction that the current symbol is the most probable symbol used to decode the current symbol; comparing a current offset and the range of the most probable symbol used to decode the current symbol, and determining the value of the current symbol; and comparing a next offset and the range of the most probable symbol used to decode the next symbol, and determining a value of the next symbol.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF THE INVENTION

Hereinafter, exemplary embodiments of the present invention will be described in detail with reference the accompanying drawings.

As described above, in related art arithmetic decoding, a range and offset of a next symbol to be decoded can be determined after determining the value of a current symbol and completing renormalization of a range and offset of the current symbol. Therefore, it is difficult to decode a plurality of symbols in parallel.

The present invention proposes that a prediction technique be used to allow a plurality of symbols to be decoded in parallel in arithmetic coding, thereby increasing decoding speed. That is, on an assumption that the current symbol is a most probable symbol (MPS), both a range and offset of the next symbol to be decoded are obtained when determining ranges of a least probable symbol (LPS) and the MPS required to decode the current symbol.

Assuming that the current symbol is S(N) that is an MPS, a new Range (N+1) and a new Offset (N+1) of a next symbol S(N+1) to be decoded are determined to be a range R(N, MPS) and an offset (N), respectively. Since the probability of the MPS is greater than 0.5 and less than 1, when a Range (N) falls within a range from 0×0100 to 0×01fe, the range R(N,MPS) falls within a range from 0×0080 to 0×01fe. Therefore, the new Range (N+1) can be maintained to be greater than 0×0100 and less than 0×01fe without renormalizing the new Range (N+1).

Accordingly, assuming that the current symbol S(N) that is currently being decoded has a value of the MPS, decoding of the next symbol S(N+1) may start after the range R(N, MPS) is determined. That is, it is possible to decode a plurality of symbols in parallel. If a value obtained by decoding the current symbol S(N) is equal to that of the MPS, a predicted value obtained by decoding the current symbol S(N) is considered to be correct and the value of the next symbol S(N+1) decoded through the prediction technique is also considered as a significant figure. However, when the actual value obtained by decoding the current symbol S(N) is equal to that of the LPS, the value of the next symbol S(N+1) decoded through prediction of the value of the current symbol S(N) to be decoded is not a significant figure and is thus discarded.

Hereinafter, an arithmetic decoding apparatus and method according to an exemplary embodiment will be described regarding CABAC decoding in greater detail with reference to FIGS. 3 through 5. However, the exemplary embodiment is not limited to CABAC decoding, and may be applied to various decoding techniques such as general arithmetic decoding and binary arithmetic decoding.

Figure 1:
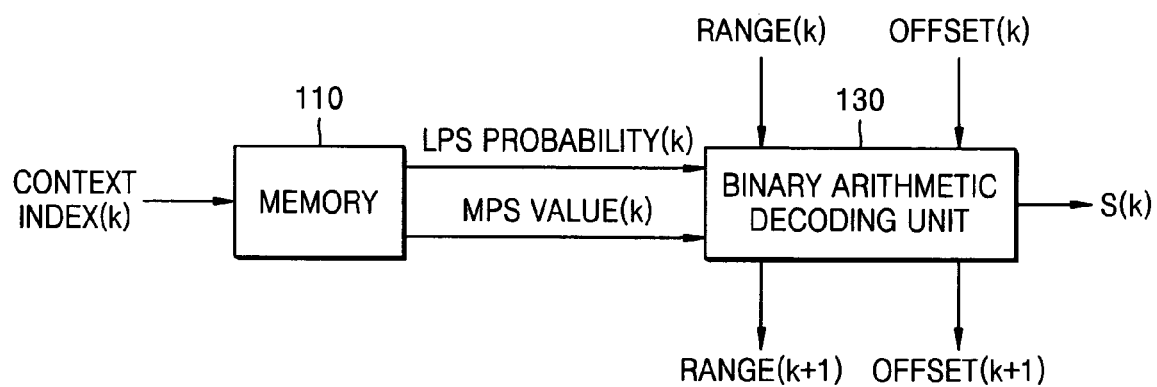
FIG. 1 is a block diagram of a related art CABAC decoder.
Figure 2:
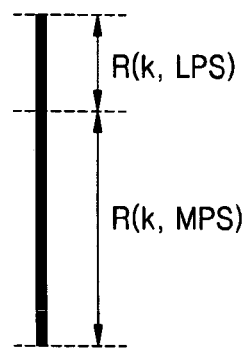
FIG. 2 illustrates a probability distribution section that includes the ranges of a most probable symbol (MPS) and a least probable symbol (LPS)
Figure 3:
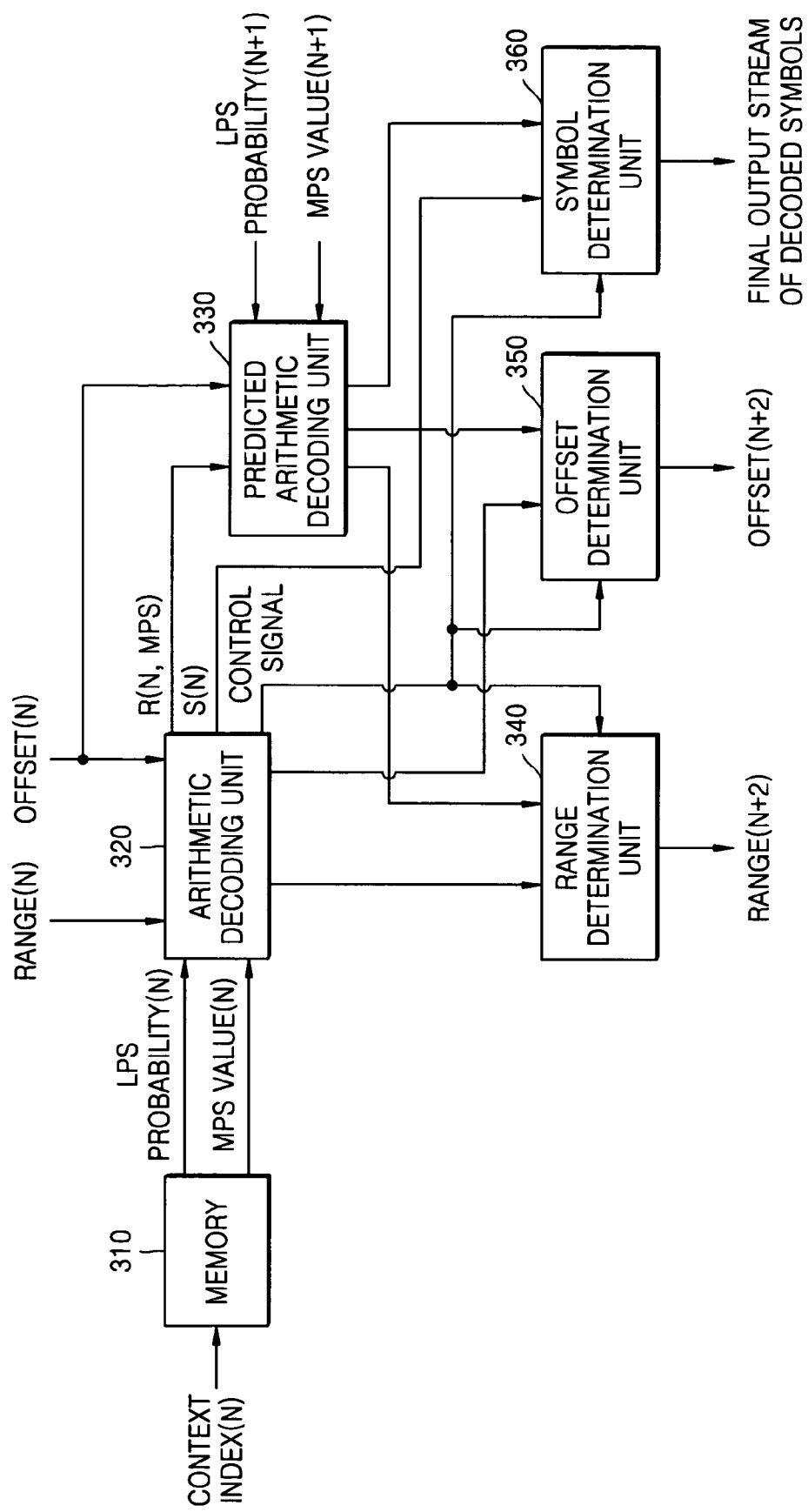
FIG. 3 is a block diagram of an arithmetic decoding apparatus according to an exemplary embodiment.

FIG. 3 is a block diagram of an arithmetic decoding apparatus according to an exemplary embodiment. The arithmetic decoding apparatus includes a memory 310, an arithmetic decoding unit 320, a predicted arithmetic decoding unit 330, a range determination unit 340, an offset determination unit 350, and a symbol determination unit 360.

The memory 310 stores a variable and a formula required to compute an LPS probability and an MPS value corresponding to a given context index. The MPEG-4 Part 10 AVC standard specifies a method of deriving an LPS probability (N) and an MPS value (N) from a context index (N). The LPS probability (N) and the MPS value (N), which are required for decoding a current symbol S(N), are provided to the arithmetic decoding unit 320 directly from the memory 310, but alternatively, they may be provided from a controller (not shown) that computes the LPS probability (N) and the MPS value (N).

The arithmetic decoding unit 320 receives the LPS probability (N), the MPS value (N), a range (N), and an offset (N), decodes the current symbol S(N), and outputs an updated range and offset to the range determination unit 340 and the offset determination unit 350, respectively. Further, the arithmetic decoding unit 320 predicts the value of the current symbol S(N) and provides a new Range (N+1) for decoding a next symbol S(N+1) to the predicted arithmetic decoding unit 330.

Assuming that the current symbol S(N) is an MPS, the new Range (N+1) of the next symbol S(N+1) to be decoded is equal to R(N,MPS) and the new Offset (N+1) is equal to the Offset (N) of the current symbol S(N). Also, the arithmetic decoding unit 320 generates a control signal indicating whether the predicted value of the decoded current symbol S(N) is correct, and transmits the control signal to the range determination unit 340, the offset determination unit 350, and the symbol determination unit 360.

The predicted arithmetic decoding unit 330 receives the new Range (N+1) for decoding the next symbol S(N+1) from the arithmetic decoding unit 320, receives an LPS probability (N+1), an MPS value (N+1), and an Offset (N+1) of the next symbol S(N+1), and arithmetically decodes the next symbol S(N+1). The LPS probability (N+1) and the MPS value (N+1) are provided from the memory 310 or the controller(not shown). Context modeling is performed on the next symbol S(N+1) to obtain the LPS probability (N+1) and the MPS value (N+1) prior to decoding of the next symbol S(N+1). As described above, assuming that the current symbol S(N) is the MPS, the Offset (N+1) for decoding the next symbol S(N+1) is equal to the Offset (N) for the current symbol S(N). Thus, the Offset (N) input to the arithmetic decoding unit 320 is also input to the predicted arithmetic decoding unit 330.

The range determination unit 340 and the offset determination unit 350 determines a Range (N+2) and an Offset (N+2) respectively for decoding a symbol S(N+2) following the next symbol S(N+1), according to whether an actual value of the current symbol S(N) decoded by the arithmetic decoding unit 320 is equal to the predicted value. Specifically, the range determination unit 340 receives a range updated by the arithmetic decoding unit 320 and a range updated by the predicted arithmetic decoding unit 330, and receives the control signal indicating whether the predicted value of the decoded current symbol S(N) is correct from the arithmetic decoding unit 320. If the control signal indicates that the prediction is correct, the range determination unit 340 determines and outputs the range updated by the predicted arithmetic decoding unit 330 as the Range (N+2) to be used in decoding the symbol S(N+2).

However, if the control signal indicates that the prediction is not correct, the range determination unit 340 determines the range updated by the predicted arithmetic decoding unit 330 to be unavailable and thus determines and outputs the range updated by the arithmetic decoding unit 320 as the Range (N+2) to be used in decoding the symbol S(N+2). In this case, since the next symbol S(N+1) is also unavailable, the symbol determination unit 360 discards it and outputs the symbol S(N+2) after the current symbol S(N).

Similarly, the offset determination unit 350 selects one of the offset updated by the arithmetic decoding unit 320 and the offset updated by the predicted arithmetic decoding unit 330 in response to the control signal received from the arithmetic decoding unit 320, and outputs the selected offset as the Offset(N+2) to be used in decoding the symbol S(N+2).

The Range (N+2) output from the range determination unit 340 and the Offset (N+2) output from the offset determination unit 350 are transmitted to the arithmetic decoding unit 320 for decoding of the next symbol S(N+2).

The symbol determination unit 360 receives the current symbol S(N) and the control signal from the arithmetic decoding unit 320, and receives the next symbol S(N+1) from the predicted arithmetic decoding unit 330. The symbol determination unit 360 outputs or discards the next symbol S(N+1) in response to the control signal.

Figure 4A:
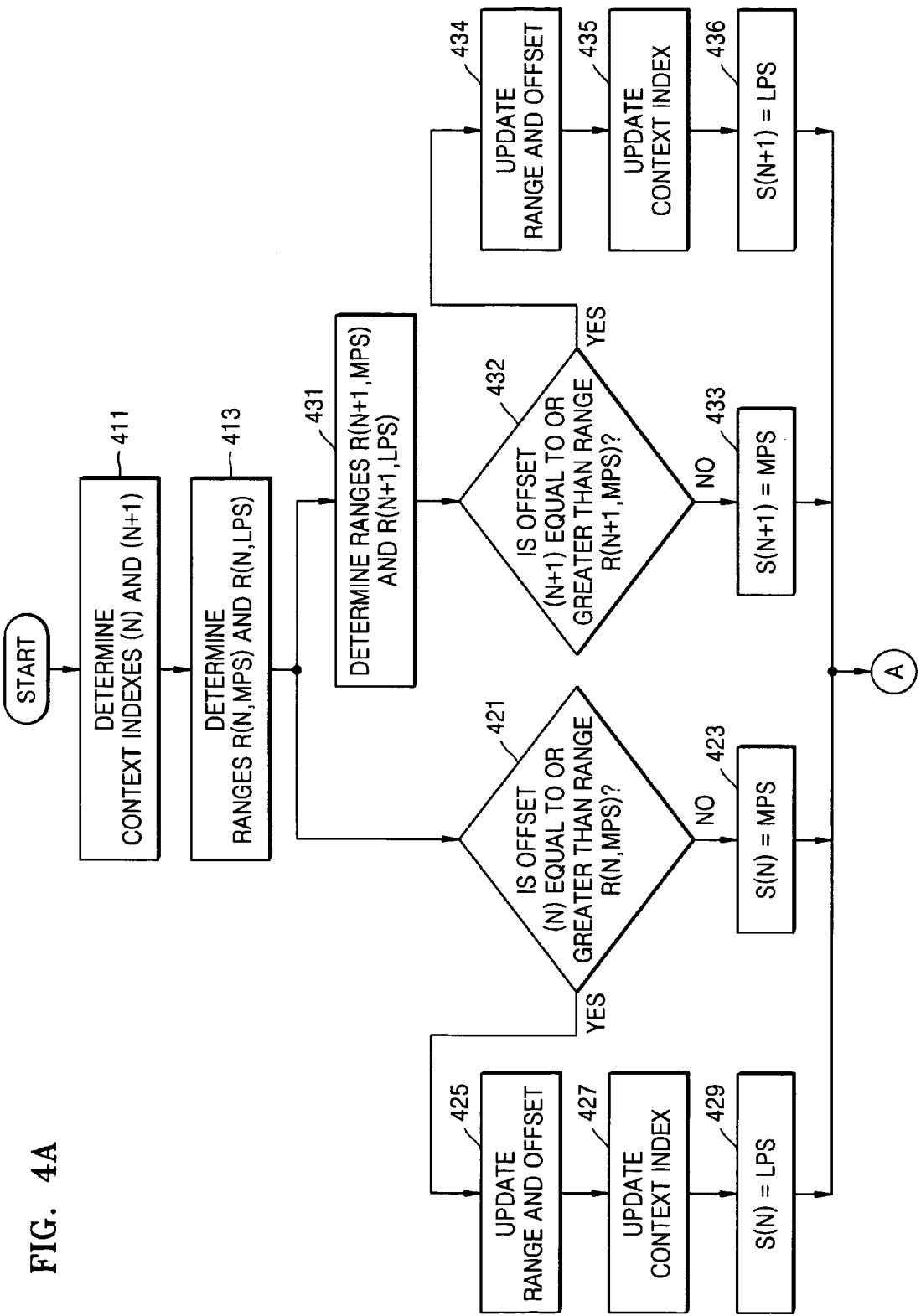
FIGS. 4A and 4B illustrate flowcharts of an arithmetic decoding method according to an exemplary embodiment.
Figure 4B:
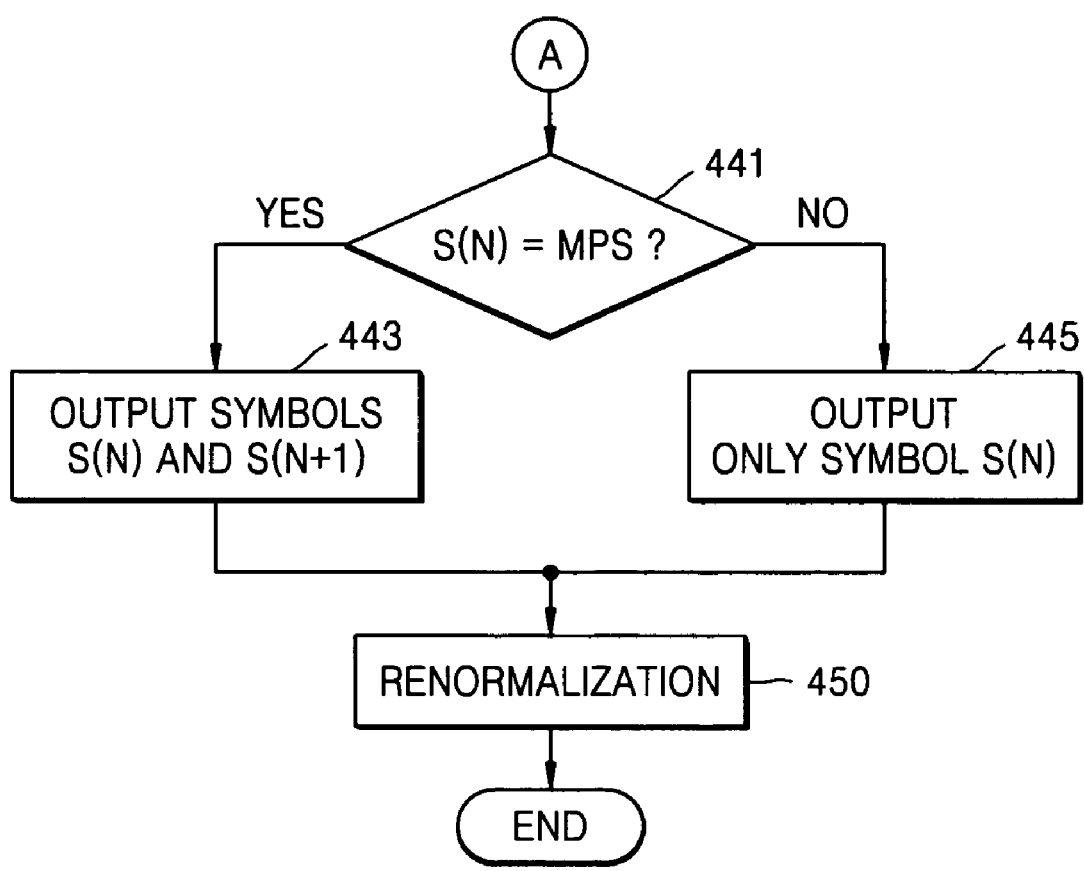

FIGS. 4A and 4B illustrate flowcharts of an arithmetic decoding method according to an exemplary embodiment. The arithmetic decoding method illustrated in FIGS. 4A and 4B is performed by the arithmetic decoding apparatus of FIG. 3 according to the exemplary.

Referring to FIG. 4A, a context index (N) for decoding a current symbol S(N) and a Context Index (N+1) for decoding a next symbol S(N+1) are determined through context modeling (operation 411).

Next, the arithmetic decoding unit 320 receives an LPS probability, an MPS value (N), a Range (N), and an Offset (N) corresponding to the Context Index (N) to decode the current symbol S(N), and determines the range R(N,LPS) of the LPS and the range R(N,MPS) of the MPS (operation 413). The range R(N,LPS) is obtained on a basis of a LPS range table, using the LPS probability (N) and the Range(N) as key values. The range R(N,MPS) of the MPS is computed by subtracting the range R(N,LPS) from the Range (N).

When the range R(N,LPS) of the LPS and the range R(N,MPS) of the MPS for decoding the current symbol S(N) are determined in operation 413, the current symbol S(N) is decoded in parallel with decoding of the next symbol S(N+1) using a prediction that the current symbol S(N) is the MPS. That is, according-to this exemplary embodiment, decoding of the next symbol S(N+1) is performed substantially simultaneously with decoding of the current symbol S(N), or delayed by several clock cycles after the current symbol S(N) is decoded.

Operations 421 through 429 are related to decoding of the current symbol S(N), performed by the arithmetic decoding unit 320, and operations 431 through 436 are related to decoding of the next symbol S(N+1), performed by the predicted arithmetic decoding unit 330. Each symbol is decoded using general arithmetic decoding, as would be well-known to one skilled in the art. Thus, a detailed description thereof is omitted.

When the current symbol S(N) is decoded, the arithmetic decoding unit 320 generates a control signal indicating whether the current symbol S(N) is the MPS, i.e., whether the predicted value of the decoded current symbol S(N) is correct, and transmits the control signal to the range determination unit 340, offset determination unit 350, and the symbol determination unit 360.

Next, the symbol determination unit 360 receives the current symbol S(N) and the control signal from the arithmetic decoding unit 320, and receives the next symbol S(N+1) from the predicted arithmetic decoding unit 330. Referring to FIG. 4B, the symbol determination unit 360 determines whether the control signal indicates that the current symbol S(N) is the MPS (operation 441). If the control signal indicates that current symbol S(N) is the MPS, the symbol determination unit 360 outputs the next symbol S(N+1) together with the current symbol S(N) (operation 443). If the current symbol S(N) is not the MPS, the symbol determination unit 360 outputs only the current symbol S(N) and discards the next symbol S(N+1) (operation 445).

Thereafter, a range and offset updated to decode a new symbol are renormalized by the arithmetic decoding unit 320 or the predicted arithmetic decoding unit 330 (operation 450).

Although not illustrated in the drawings, the range determination unit 340 and the offset determination unit 350 determine a Range (N+2) and an Offset (N+2), respectively for decoding a symbol S(N+2) following the next symbol S(N+1), in response to the control signal generated by the arithmetic decoding unit 320. In other words, the range determination unit 340 receives the range updated by the arithmetic decoding unit 320 and the range updated by the predicted arithmetic decoding unit 330, and further receives the control signal indicating whether the predicted value of the decoded current symbol S(N) is correct from the arithmetic decoding unit 320. If the control signal indicates that the predicted value is correct, the range determination unit 340 determines and outputs the range updated by the predicted arithmetic decoding unit 330 as a Range (N+2) for decoding the symbol S(N+2). If the control signal indicates that the predicted value is not correct, the range determination unit 340 determines the range updated by the predicted arithmetic decoding unit 330 to be unavailable and outputs the range updated by the arithmetic decoding unit 320 as the Range (N+2) for decoding the symbol S(N+2). In this case, since the next symbol S(N+1) is also unavailable, the symbol determination unit 360 discards the next symbol S(N+1) and outputs the symbol S(N+2) following the current symbol S(N).

Similarly, the offset determination unit 350 selects one of the offset updated by the arithmetic decoding unit 320 and the offset updated by the predicted arithmetic decoding unit 330 in response to the control signal received from the arithmetic decoding unit 320, and outputs the selected offset as the Offset (N+2) for decoding the symbol S(N+2).

The Range (N+2) output from the range determination unit 340 and the Offset (N+2) output from the offset determination unit 350 are transmitted to the arithmetic decoding unit 320 to decode the next symbol S(N+2). Then, decoding of 2-bit symbols in a parallel manner is repeated.

Figure 5:
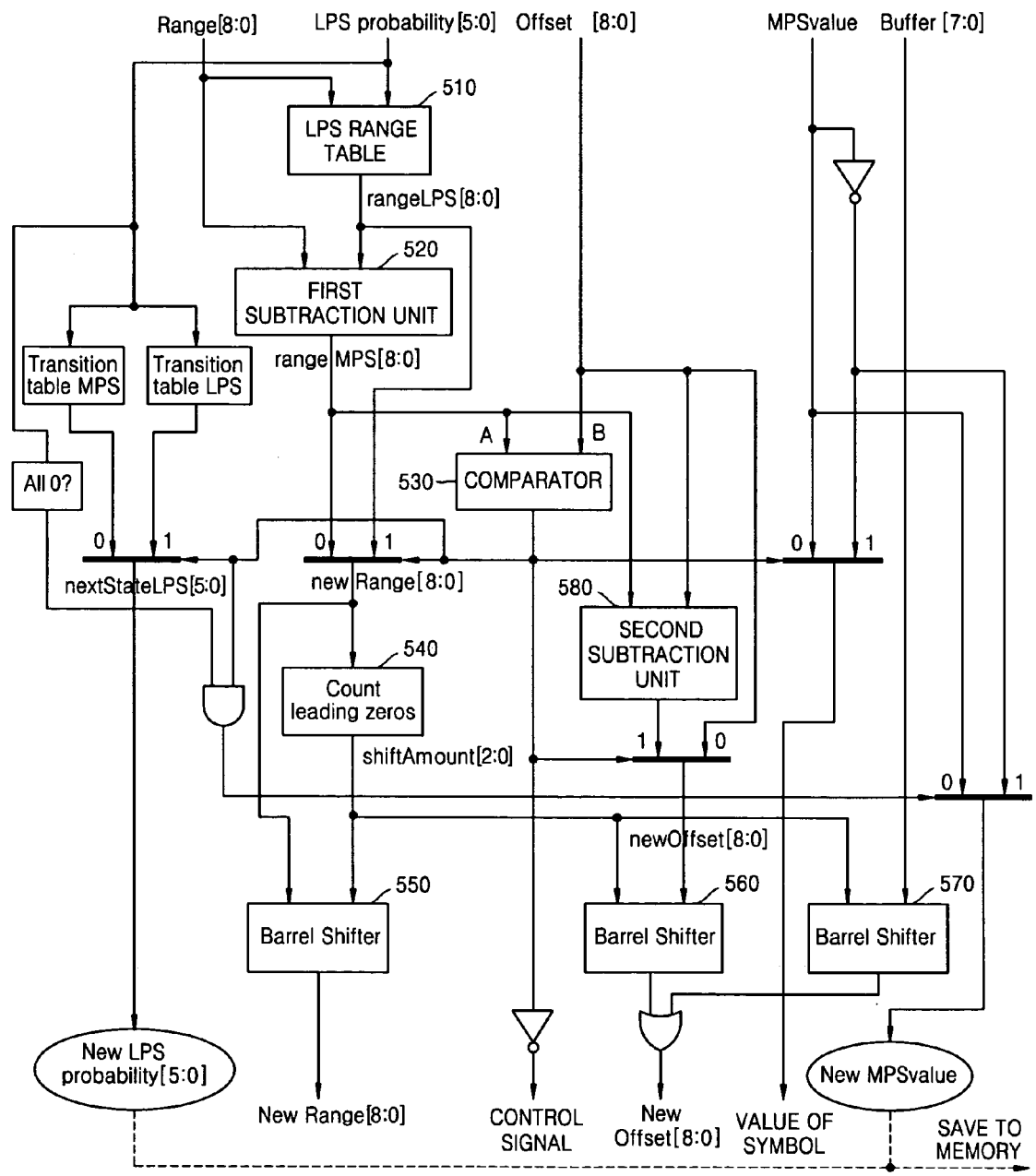
FIG. 5 is a detailed block diagram of an arithmetic decoding unit illustrated in FIG. 3 according to an exemplary embodiment.

FIG. 5 is a detailed block diagram of the arithmetic decoding unit 320 of FIG. 3 according to an exemplary embodiment. The arithmetic decoding unit 320 is different from a related art arithmetic decoding unit in that it outputs a control signal indicating whether a prediction that the current symbol S(N) is the MPS is correct. Specifically, in the arithmetic decoding unit 320, a comparator 530 receives and compares an offset and range of MPS. The comparator 530 outputs a signal indicating that the current symbol S(N) is the MPS when the offset is less than the range of MPS, and outputs a signal indicating that the current symbol S(N) is the LPS when the offset is equal to or greater than the range of MPS.

Tables 1 and 2 show simulation results when the exemplary embodiment was applied to CABAC, which is one the MPEG-4 Part 10 AVC models. Particularly, the simulation of the results shown in Table 1 was performed with an example video file entitled "CAR.yuv" used to evaluate the MPEG-4 Part 10 AVC models, and the simulation of the results shown in Table 2 was performed with an example video filed entitled "CHEER.yuv". Each of the example video files consists of 120 frames and has resolution of 720×480.

TABLE 1

| Syntax Element | Unpredictable | Prediction Try | Prediction True | Hit Rate(%) | Savings(%) |
|---|---|---|---|---|---|
| mb_type | 111198 | 229274 | 113453 | 49.48 | 24.99 |
| sub_mb_type | 22117 | 69787 | 30871 | 44.23 | 25.14 |
| Intra_Prediction (Luma) | 184026 | 1162142 | 322063 | 27.71 | 19.30 |
| Intra_Prediction (Chroma) | 17874 | 79245 | 55497 | 70.03 | 36.36 |
| Ref. Frame | 0 | 145627 | 31308 | 21.49 | 17.69 |
| Motion Vector Difference | 61438 | 517972 | 339326 | 65.51 | 36.93 |
| Significant map | 879216 | 6554946 | 2862279 | 43.66 | 27.79 |
| Coefficient level | 1610 | 5634054 | 1103142 | 19.59 | 16.36 |
| Bypass mode | 0 | 189473 | 149250 | 78.77 | 44.06 |
| Total | 1277479 | 14582520 | 5007189 | 34.33 | 23.99 |

TABLE 2

| Syntax Element | Unpredictable | Prediction Try | Prediction True | Hit Rate(%) | Savings(%) |
|---|---|---|---|---|---|
| mb_type | 114337 | 301777 | 181998 | 60.30 | 30.42 |
| sub_mb_type | 67381 | 200760 | 102604 | 51.10 | 27.67 |
| Intra_Prediction (Luma) | 213857 | 1224801 | 530794 | 43.33 | 26.95 |
| Intra_Prediction (Chroma) | 17765 | 65034 | 35053 | 53.89 | 29.74 |
| Ref. Frame | 0 | 314216 | 46254 | 14.72 | 12.83 |
| Motion Vector Difference | 114504 | 1177466 | 806332 | 68.48 | 38.42 |
| Significant map | 1221938 | 9223126 | 3324455 | 36.04 | 24.14 |
| Coefficient level | 1124 | 8403895 | 1416503 | 16.85 | 14.42 |
| Bypassmode | 0 | 314323 | 242158 | 77.04 | 43.51 |
| Total | 1750906 | 21225398 | 6686151 | 31.50 | 22.54 |

Tables 1 and 2 reveal that the performance CABAC according to the exemplary embodiment is higher by about 23% or 24% than that of related art CABAC.

The present invention may be embodied as computer readable code in a computer readable medium. Here, the computer readable medium may be any recording apparatus capable of storing data that is read by a computer system, e.g., a read-only memory (ROM), a random access memory (RAM), a compact disc (CD)-ROM, a magnetic tape, a floppy disk, an optical data storage device, and so on. Also, the computer readable medium may be a carrier wave that transmits data via the Internet, for example but not by way of limitation. The computer readable medium can be distributed among computer systems that are interconnected through a network, and the present invention may be stored and implemented as a computer readable code in the distributed system.

As described above, according to the present invention, it is possible to process a plurality of symbols in parallel during arithmetic decoding using the prediction technique, thereby significantly improving the speed of decoding.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An arithmetic decoding apparatus comprising:
an arithmetic decoding unit which determines a range of a most probable symbol and a range of a least probable symbol required to decode a current symbol, comparing a current offset and the range of the most probable symbol required to decode the current symbol, and determines and outputs a value of the current symbol; and a predicted arithmetic decoding unit which determines a range of a most probable symbol and a range of a least probable symbol required to decode a next symbol using a prediction that the current symbol is the most probable symbol, compares a next offset and the range of the most probable symbol required to decode the next symbol, and determines and outputs a value of the next symbol.

2. The arithmetic decoding apparatus of claim 1, wherein the arithmetic decoding unit outputs a control signal indicative of whether the prediction is correct, and the arithmetic decoding apparatus further comprising a symbol determination unit which receives the value of the next symbol from the predicted arithmetic decoding unit, and determines whether the determined value of the next symbol is a significant figure in response to the control signal output from the arithmetic decoding unit.

3. The arithmetic decoding apparatus of claim 2, wherein the symbol determination unit outputs the value of the next symbol if the control signal indicates that the prediction is correct.

4. The arithmetic decoding apparatus of claim 2, wherein the symbol determination unit disregards the value of the next symbol if the control signal indicates that the prediction is not correct.

5. The arithmetic decoding apparatus of claim 1, wherein said apparatus is configured to be applied to binary arithmetic decoding.

6. The arithmetic decoding apparatus of claim 1, wherein said apparatus is configured to be applied to context adaptive binary arithmetic decoding.

7. An arithmetic decoding method comprising:
determining a range of a most probable symbol and a range of a least probable symbol which are required to decode a current symbol;
determining a range of a most probable symbol and a range of a least probable symbol which are required to decode a next symbol using a prediction that the current symbol is the most probable symbol used to decode the current symbol;
comparing a current offset and the range of the most probable symbol used to decode the current symbol, and determining a value of the current symbol; and
comparing a next offset and the range of the most probable symbol used to decode the next symbol and determining a value of the next symbol.

8. The arithmetic decoding method of claim 7, further comprising determining the determined value of the next symbol as a significant figure if the prediction is correct.

9. The arithmetic decoding method of claim 7, further comprising determining the determined value of the next symbol as an insignificant figure if the prediction is not correct.

10. The arithmetic decoding method of claim 7, wherein said arithmetic decoding method is of a binary type.

11. The arithmetic decoding method of claim 7, wherein said arithmetic decoding method is of a context adaptive binary type.

12. A computer readable recording medium having embodied thereon a program for executing an arithmetic decoding method is stored, wherein the arithmetic decoding method comprises:
determining a range of a most probable symbol and a range of a least probable symbol which are required to decode a current symbol;
determining a range of a most probable symbol and a range of a least probable symbol required to decode a next symbol using a prediction that the current symbol is the most probable symbol used to decode the current symbol;
comparing a current offset and the range of the most probable symbol used to decode the current symbol, and determining a value of the current symbol; and
comparing a next offset and the range of the most probable symbol used to decode the next symbol, and determining a value of the next symbol.

13. The computer readable recording medium of claim 12, wherein the arithmetic decoding method further comprises determining the determined value of the next symbol as a significant figure if the prediction is correct.

14. The computer readable recording medium of claim 12, wherein the arithmetic decoding method further comprises determining the determined value of the next symbol as an insignificant figure if the prediction is not correct.

15. The computer readable recording medium of claim 12, wherein said arithmetic decoding method is of a binary type.

16. The computer readable recording medium of claim 12, wherein the arithmetic decoding method is of a context adaptive binary type.

* * * * *